United States Patent
Do et al.

(10) Patent No.: US 7,993,979 B2
(45) Date of Patent: Aug. 9, 2011

(54) LEADLESS PACKAGE SYSTEM HAVING EXTERNAL CONTACTS

(75) Inventors: Byung Tai Do, Singapore (SG); Linda Pei Ee Chua, Singapore (SG); Heap Hoe Kuan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 232 days.

(21) Appl. No.: 11/964,567

(22) Filed: Dec. 26, 2007

(65) Prior Publication Data

US 2009/0166824 A1  Jul. 2, 2009

(51) Int. Cl.
*H05K 3/34* (2006.01)
*H05K 3/38* (2006.01)
*H01L 23/28* (2006.01)
*H01L 21/48* (2006.01)
*H01L 23/31* (2006.01)

(52) U.S. Cl. ........ 438/123; 438/124; 438/125; 438/126; 438/127; 438/118; 257/738; 257/692; 257/736; 257/737; 257/773; 257/778; 257/784; 257/787; 257/E23.046; 257/E23.124

(58) Field of Classification Search ............... 257/676, 257/691, 692, 786, E23.03, E23.046, E23.124; 438/123–127, 118

See application file for complete search history.

(56) References Cited

U.S. PATENT DOCUMENTS

| | | | |
|---|---|---|---|
| 5,656,550 A * | 8/1997 | Tsuji et al. | 438/123 |
| 5,847,458 A * | 12/1998 | Nakamura et al. | 257/738 |
| 6,001,671 A | 12/1999 | Fjelstad | |
| 6,333,252 B1 | 12/2001 | Jung et al. | |
| 6,498,099 B1 | 12/2002 | McLellan et al. | |
| 6,759,271 B2 * | 7/2004 | Miyazaki | 438/108 |
| 6,933,594 B2 | 8/2005 | McLellan et al. | |
| 6,969,905 B2 | 11/2005 | Paulus | |
| 7,049,177 B1 | 5/2006 | Fan et al. | |
| 2002/0027010 A1 * | 3/2002 | Glenn | 174/52.2 |
| 2007/0052076 A1 * | 3/2007 | Ramos et al. | 257/676 |
| 2007/0090495 A1 | 4/2007 | Kim et al. | |

* cited by examiner

*Primary Examiner* — Zandra Smith
*Assistant Examiner* — Tsz K Chiu
(74) *Attorney, Agent, or Firm* — Mikio Ishimaru

(57) ABSTRACT

A leadless package system includes: providing a chip carrier having indentations defining a pattern for a protrusion for external contact terminals; placing an external coating layer in the indentations in the chip carrier; layering a conductive layer on top of the external coating layer; depositing an internal coating layer on the conductive layer; patterning the internal coating layer and the conductive layer to define external contact terminals with a T-shape profile; connecting an integrated circuit die to the external contact terminals; encapsulating the integrated circuit die and external contact terminals; and separating the chip carrier from the external coating layer.

10 Claims, 11 Drawing Sheets

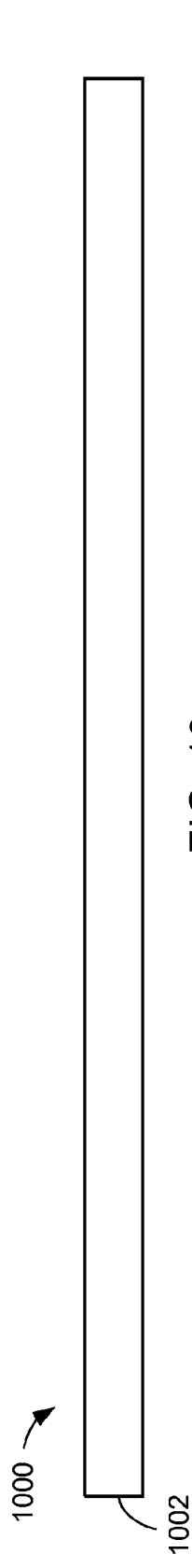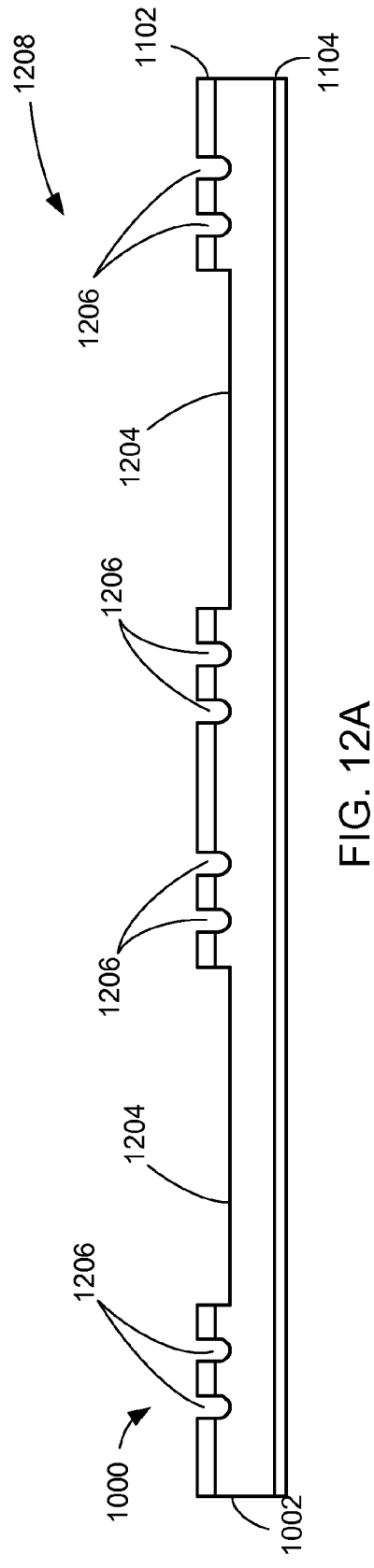

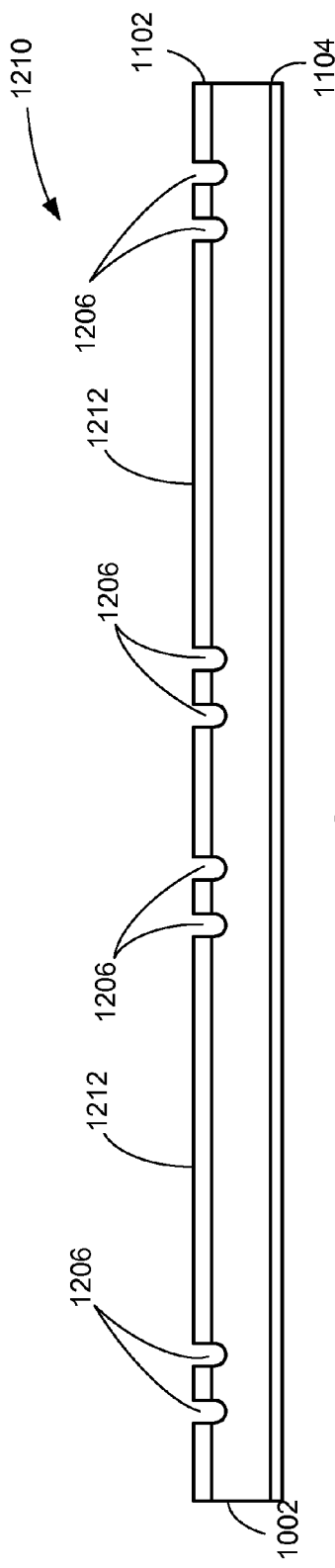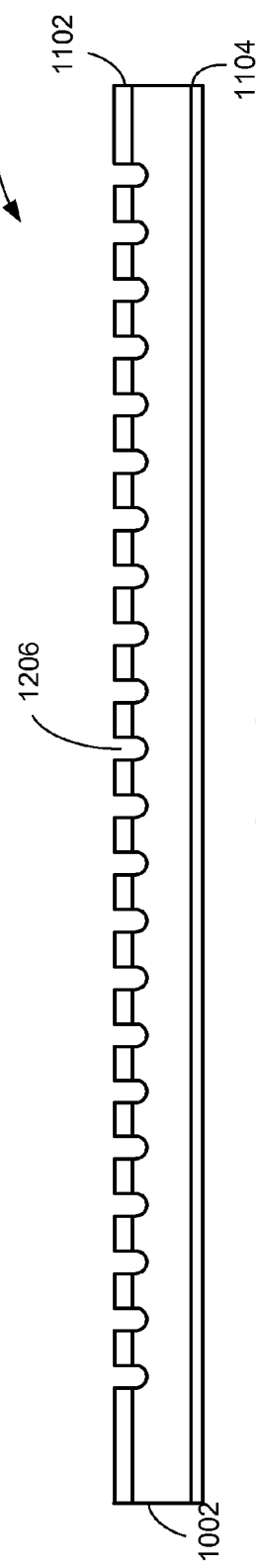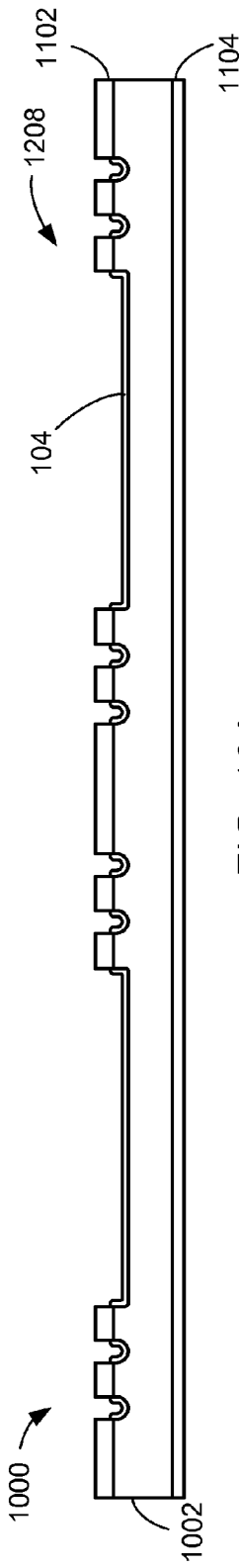

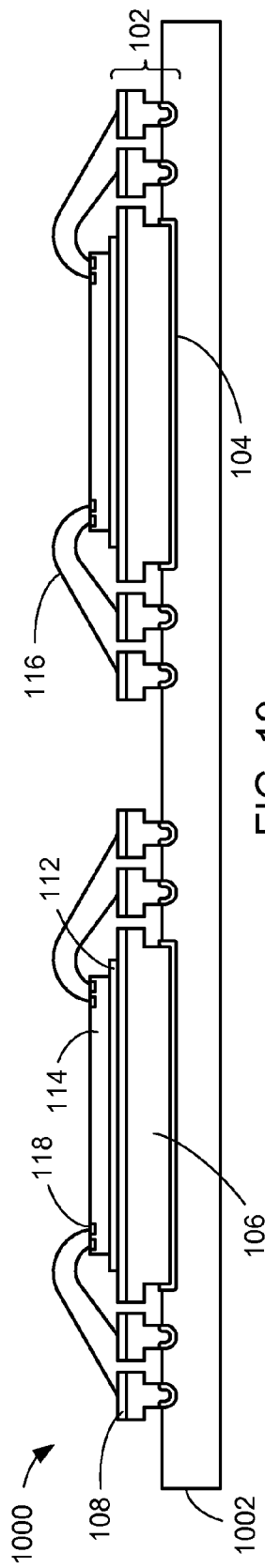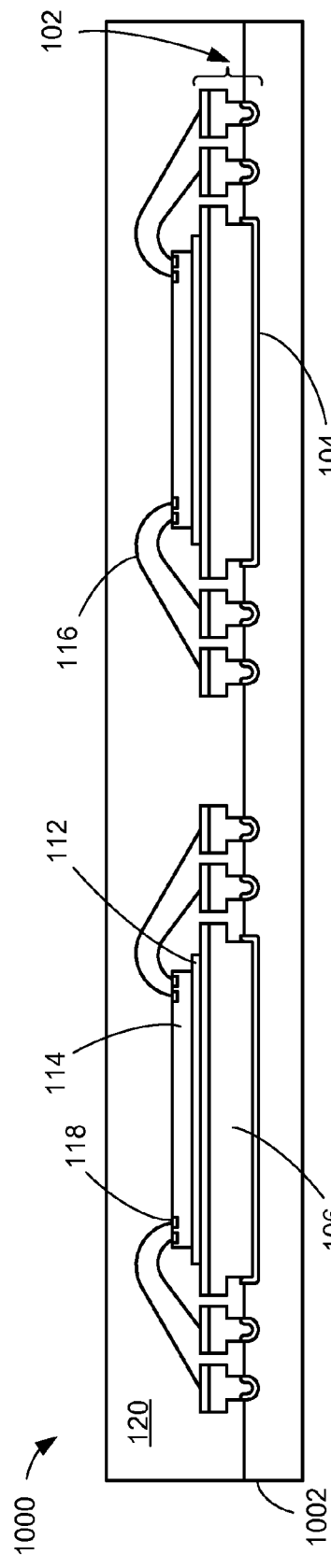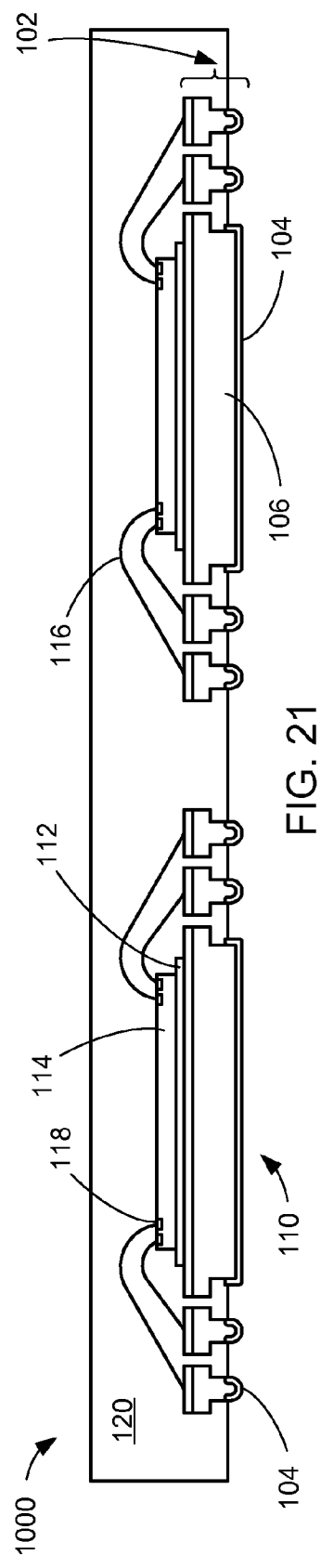

LEADLESS PACKAGE SYSTEM HAVING EXTERNAL CONTACTS

TECHNICAL FIELD

The present invention relates generally to semiconductor technology and more particularly to a leadless package system for integrated circuits.

BACKGROUND ART

Integrated circuit ("ICs") packages provide mechanical and electrical connections between micron and sub-micron scale circuits defined on an IC die (a "chip") and a printed circuit board ("PCB") such as the motherboard of a computer. The IC packages define many of the individual components that are incorporated within circuit boards inside electronic products such as a computer.

As new generations of electrical consumer products are developed, there is a growing need to improve the functionality, performance, reliability, and manufacturing robustness of IC packages. Additionally, miniaturization of handheld devices such as cell phones imposes restrictions on the size and thickness of the package. In general, the goal is to economically produce a chip-scale package (CSP) of the smallest size possible while maintaining a very high performance level.

Conventionally, IC packages are multilayered structures, typically incorporating metal pins ("leads") that provide a path for electrical power and signal transfer between the IC die and an external device and an encapsulant, such as a molding compound, encapsulating the electrical components. Leadless packages have external contact terminals or pads formed directly on the surface of the package. The encapsulant provides electrical isolation between the leads or external contact terminals, and protects the IC die and internal electrical connections from environmental and mechanical disruptions.

A conventional IC package is fabricated by mounting an IC die onto a paddle of a leadframe ("die-bonding"), electrically connecting the IC die on the paddle to inner leads using thin metal wires ("wire-bonding"), encapsulating a predetermined portion of the assembly containing the IC die, inner leads, and bond wires, with an epoxy resin to form a package body ("molding"), and separating each assembly as individual, independent chip scale packages ("singulation").

The IC packages, thus manufactured, are then mounted by matching and soldering the external leads or contact pads thereof to a matching pattern on a printed circuit board, to thereby enable power and signal input/output ("I/O") operations between the semiconductor devices in the packages and the circuit board.

"Flip-chip" technology, as originating with controlled-collapse chip connection is an example of an assembly and packaging technology that results in an IC die being oriented substantially parallel to a carrier substrate, such as a printed circuit board. In flip-chip technology, the bond pads or contact pads of an IC die are arranged in an array over a major surface of the semiconductor device. Flip-chip techniques are applicable to both bare and packaged IC dies. A packaged flip-chip type IC die, which typically has solder balls arranged in a so-called "ball grid array" (BGA) connection pattern, typically includes an IC die and a carrier substrate, which is typically termed an "interposer." The interposer may be positioned adjacent either the back side of the semiconductor die or the active (front) surface thereof.

There is an on-going need to integrate more functionality and to decrease package thickness and footprint while operating at high circuit speeds. These requirements are addressed using leadless packages with a high density of contact terminals. Thus, the packages must be designed for reliability and must have excellent electrical contact characteristics between the external contact terminals or pads and the printed circuit board. It is increasingly difficult to obtain these levels of package specifications without experiencing contact terminal delamination or signal degradation from poor contacts between the IC package and the printed circuit board.

Thus, a need still remains for IC packaging systems that improve the functionality, performance, reliability, and manufacturing robustness of electronic components. In view of the contact failures and contact surface delamination problems observed in industry, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a leadless package system including: providing a chip carrier having indentations defining a pattern for a protrusion for external contact terminals; placing an external coating layer in the indentations in the chip carrier; layering a conductive layer on top of the external coating layer; depositing an internal coating layer on the conductive layer; patterning the internal coating layer and the conductive layer to define external contact terminals with a T-shape profile; connecting an integrated circuit die to the external contact terminals; encapsulating the integrated circuit die and external contact terminals; and separating the chip carrier from the external coating layer.

Certain embodiments of the invention have other aspects in addition to or in place of those mentioned above. The aspects will become apparent to those skilled in the art from a reading of the following detailed description when taken with reference to the accompanying drawings.

BRIEF DESCRIPTION OF THE DRAWINGS

FIG. 10 is a cross-sectional view of a leadless package system in the initial stages of fabrication according to an embodiment of the present invention;

FIG. 11 is the structure of FIG. 10 following deposition or application thereon of photoresist on both sides of the structure;

FIG. 12A is the structure of FIG. 11 following patterning of indentations on the top surface of the chip carrier;

FIG. 12B is the structure of FIG. 11 following the patterning of indentations corresponding to the embodiment of the leadless package system shown in FIG. 6;

FIG. 12C is the structure of FIG. 11 following the patterning of indentations corresponding to the embodiment of the leadless package system shown in FIG. 7;

FIG. 13A is the structure of FIG. 12A following application of an external coating layer on the indentations defined in the chip carrier;

FIG. 19 is the structure of FIG. 18 following wire bonding contact terminals on the IC die to the internal coating layer on the external contact terminals;

FIG. 20 is the structure of FIG. 19 after encapsulation of the portions thereof above the chip carrier using an encapsulant;

FIG. 21 is the structure of FIG. 20 following dissolving the chip carrier shown in FIG. 20;

BEST MODE FOR CARRYING OUT THE INVENTION

Figure 1:
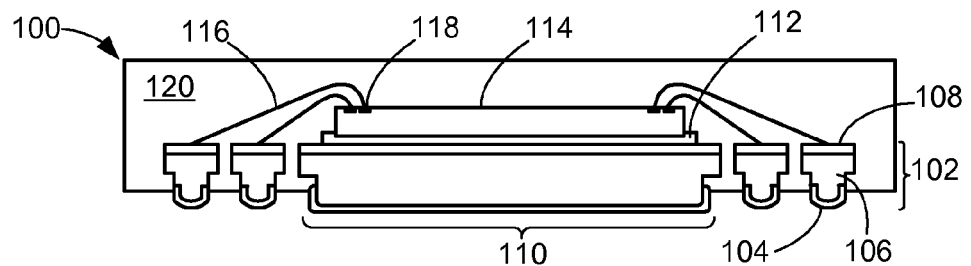
FIG. 1 is a cross-sectional view of a leadless package system according to an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit (IC) package, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements. The term "processing" as used herein includes deposition of material or photoresist, patterning, exposure, development, etching, cleaning, and/or removal of the material or photoresist as required in forming a described structure. The term "system" as used herein refers to and is defined as the method and as the apparatus of the present invention in accordance with the context in which the term is used.

Referring now to FIG. 1, therein is shown a cross-sectional view of a leadless package system 100 according to an embodiment of the present invention. The leadless package system 100 includes external contact terminals 102 incorporating an external coating layer 104, a conductive layer 106, and an internal coating layer 108. A die attach pad 110 is surrounded by the external contact terminals 102. An adhesive 112 attaches an IC die 114 to the die attach pad 110. Bond wires 116 provide an electrical connection between the external contact terminals 102 and contact pads 118 in the IC die 114. A single encapsulant 120, such as a molding compound, encapsulates the IC die 114, the bond wires 116, and the external contact terminals 102 including the external coating layer 104.

Figure 2:
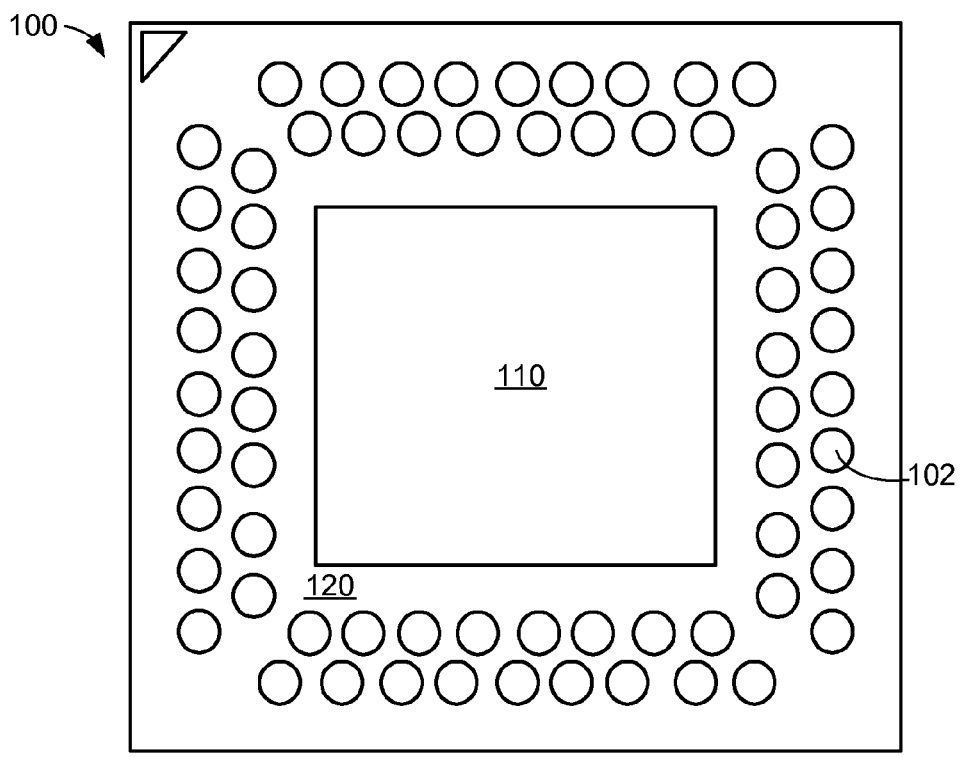
FIG. 2 is a bottom view of the leadless package system shown in FIG. 1.

Referring now to FIG. 2, therein is shown a bottom plan view of the leadless package system 100 shown in FIG. 1. In this embodiment, the die attach pad 110 is positioned at the center of the leadless package system 100. The external contact terminals 102 are placed in the periphery of the leadless package system 100. The encapsulant 120 surrounds all of the external contact terminals 102.

Figure 3:
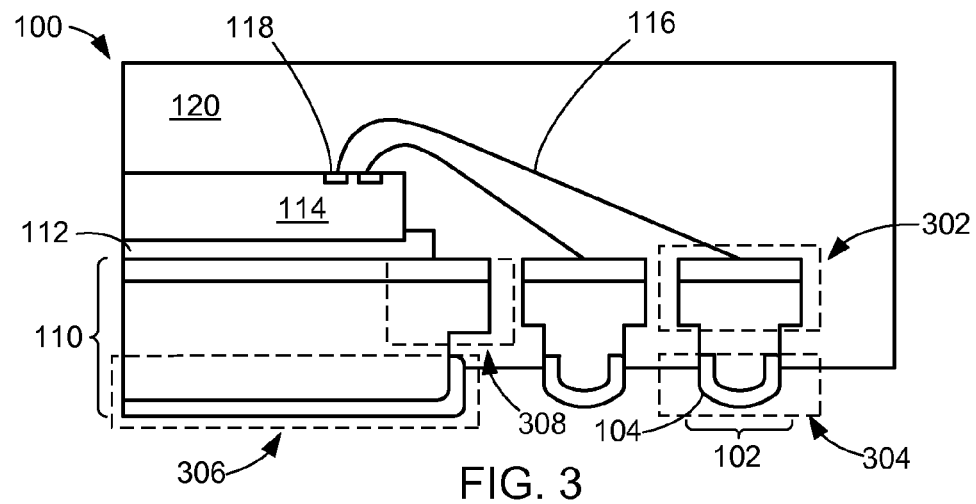
FIG. 3 is an expanded view of the right portion of FIG. 1.

Referring now to FIG. 3, therein is shown an expanded view of the right portion of FIG. 1 showing the external contact terminals 102, the die attach pad 110, the adhesive 112, the IC die 114 with the contact pads 118, the bond wires 116, and the encapsulant 120. The external contact terminals 102 have a top portion with a T-shape profile 302 and a bottom portion with a protrusion 304 extending below the encapsulant 120.

Similarly, the die attach pad 110 has a top portion with a T-shape profile 308 and a bottom portion with a protrusion 306 extending below the encapsulant 120. In this embodiment of the present invention, the external coating layer 104 covers the protrusion 304 of the external contact terminals 102 and the protrusion 306 of the die attach pad 110.

It has been discovered that the T-shape profile 302 locks the external contact terminals 102 to the encapsulant 120 significantly increasing the adhesive strength between these two elements and reducing failures of the leadless package system 100 due to delamination of the external contact terminals 102.

Figure 4:
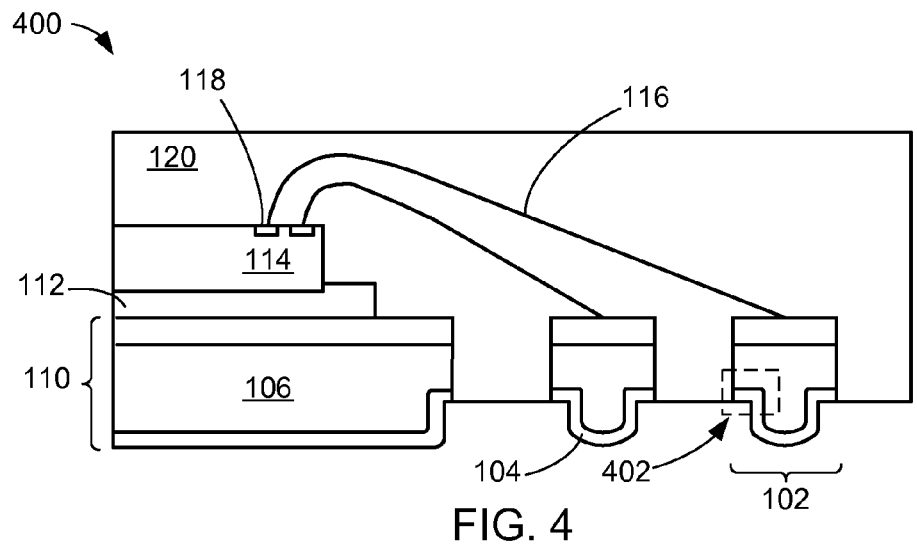
FIG. 4 is a cross-sectional view of an embodiment of the leadless package system with an external coating layer with extensions.

Referring now to FIG. 4, therein is shown a cross-sectional view of an embodiment of a leadless package system 400 with an external coating layer 104 with extensions 402. The extensions 402 are defined as portions of the external coating layer 104 that extend out from the main portions of the external coating layer 104 in the encapsulant 120.

As in the embodiment shown in FIG. 1, the leadless package system 400 includes the external contact terminals 102, the die attach pad 110, and the adhesive 112 for fixing the IC die 114 to the die attach pad 110. Bond wires 116 provide an electrical connection between the contact pads 118 in the IC die 114 and the external contact terminals 102. The encapsulant 120 encapsulates the IC die 114, the bond wires 116, the die attach pad 110, and the external contact terminals 102. In this embodiment the external contact terminals 102 and the die attach pad 110 include a horizontal extension of the conductive layer 106 which provides a support for the extensions 402 of the external coating layer 104.

Figure 5:
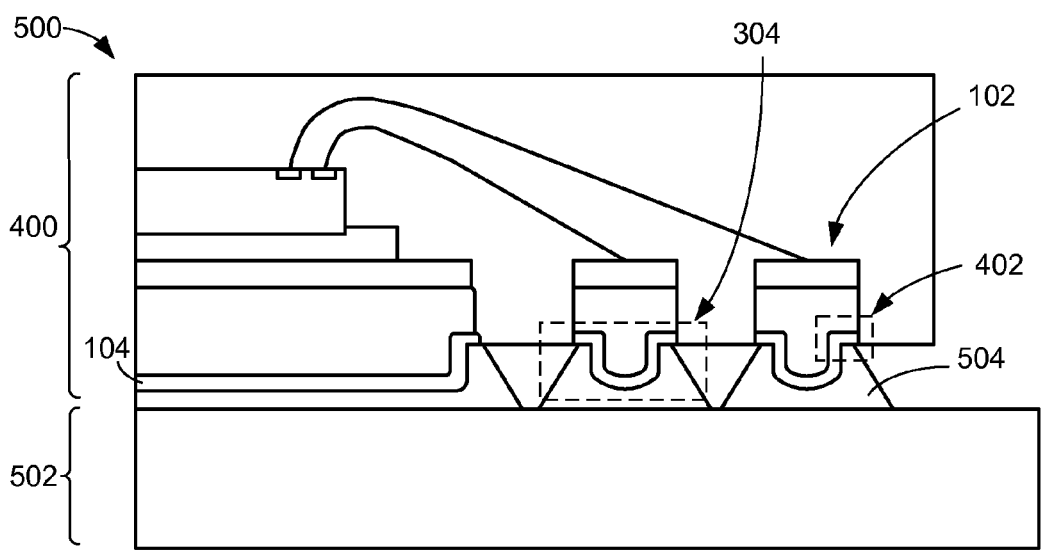
FIG. 5 is a cross-sectional view the structure of FIG. 4 attached to a printed circuit board.

Referring now to FIG. 5, therein is shown a cross-sectional view of the structure of FIG. 4 attached to a printed circuit board 502. In an assembly 500, the leadless package system 400 is attached to the printed circuit board 502 using solder joints 504. The protrusion 304 of the external contact terminals 102 provides good contact surface area for the solder joints 504. The extensions 402 of the external coating layer 104 provides added wetting surface area for the solder joints 504, forming more robust connections with added mechanical strength, thus improving overall board-level reliability.

Figure 6:
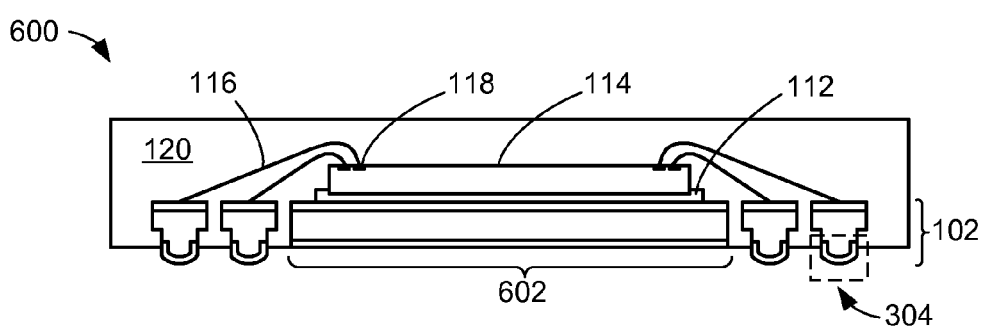
FIG. 6 is a cross-sectional view of a leadless package system with a non-protruding die attach pad according to another embodiment of the present invention.

Referring now to FIG. 6, therein is shown a cross-sectional view of a leadless package system 600 with a non-protruding die attach pad 602 according to another embodiment of the present invention. The leadless package system 600 includes the external contact terminals 102 with the protrusion 304 and the non-protruding die attach pad 602 which does not have the protrusion 304. The adhesive 112 attaches the IC die 114 to the non-protruding die attach pad 602. Bond wires 116 electrically connect the external contact terminals 102 to the contact pads 118 in the IC die 114. The encapsulant 120 encapsulates at least portions of the non-protruding die attach pad 602, the IC die 114, the bond wires 116, and the external contact terminals 102.

Figure 7:
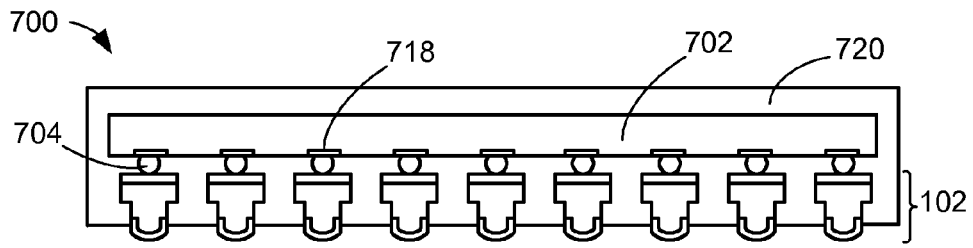
FIG. 7 is a cross-sectional view of a leadless package system for a flip-chip IC die.

Referring now to FIG. 7, therein is shown a cross-sectional view of a leadless package system 700 for a flip-chip IC die 702. In flip-chip technology, solder balls 704 provide an electrical connection between contact pads 718 distributed over the surface of the flip-chip IC die 702 and the external contact terminals 102 distributed underneath the flip-chip IC die 702. An encapsulant 720, such as a molding compound, encapsulates at least portions of the flip-chip IC die 702, the solder balls 704, and the external contact terminals 102.

Figure 8:
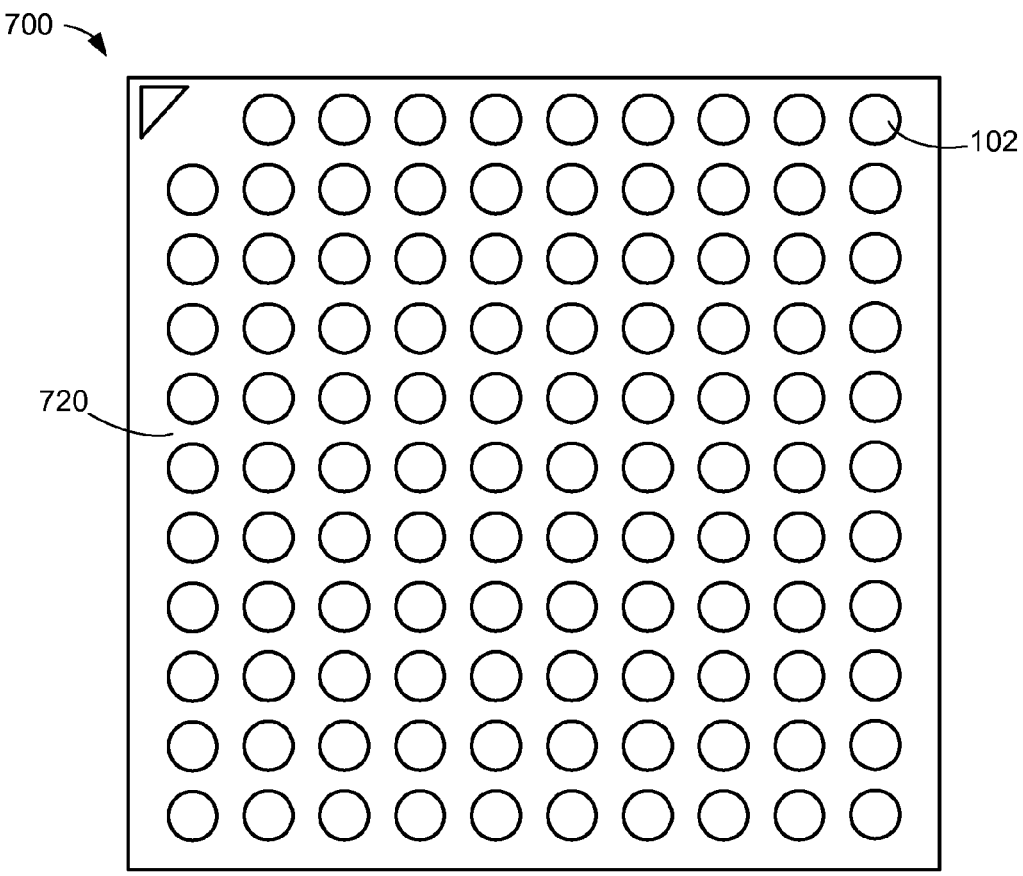
FIG. 8 is a bottom plan view of the leadless package system of FIG. 7.

Referring now to FIG. 8, therein is shown a bottom plan view of the leadless package system 700 of FIG. 7. In this example, the external contact terminals 102 are distributed across the leadless package system 700. The encapsulant 720 surrounds all of the external contact terminals 102.

Figure 9:
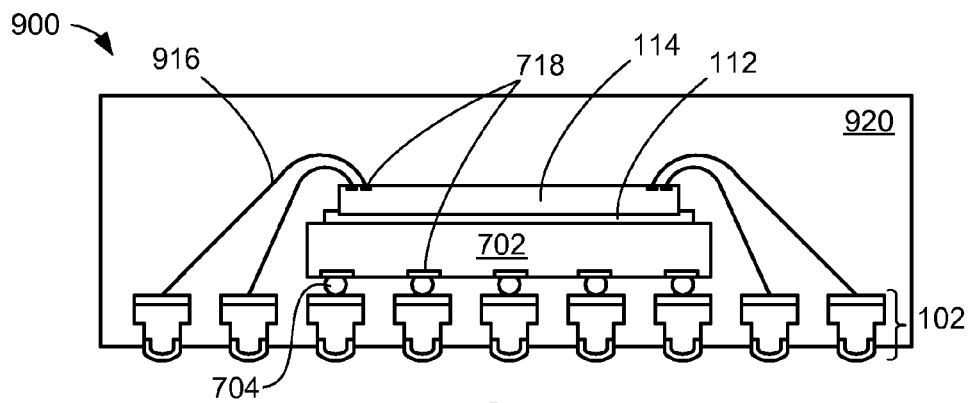
FIG. 9 is a cross-sectional view of a leadless package system for two stacked IC dies.

Referring now to FIG. 9, therein is shown a cross-sectional view of a leadless package system 900 for two stacked IC dies. The leadless package system 900 combines the flip-chip IC die 702 and the IC die 114 attached on top of the flip-chip IC die 702 using the adhesive 112. The contact pads 718 in the flip-chip IC die 702 are connected to the external contact terminals 102 using the solder balls 704, and the contact pads 118 in the IC die 114 are connected to the external contact terminals 102 using bond wires 916. An encapsulant 920, such as a molding compound, encapsulates at least portions of the flip-chip IC die 702, the IC die 114, the solder balls 704, the bond wires 916, and portions of the external contact terminals 102.

Referring now to FIG. 10, therein is shown a cross-sectional view of a leadless package system 1000 in the initial stages of fabrication according to an embodiment of the present invention. The fabrication results in the formation of the leadless package system 100 shown in FIG. 1. At the initial stage of the fabrication shown in FIG. 10 a chip carrier 1002 is provided. The chip carrier 1002 is generally a rectangular or circular flat panel made of copper, a copper alloy, aluminum, an aluminum alloy, or a polymer material.

Referring now to FIG. 1, therein is shown the chip structure of FIG. 10 following deposition or application thereon of photoresist on both sides of the structure. A top photoresist layer 1102 is deposited on the top side of the chip carrier 1002 and a bottom photoresist layer 1104 is deposited on the bottom side of the chip carrier 1002.

Referring now to FIG. 12A, therein is shown the structure of FIG. 11 following patterning of indentations 1208 on the top surface of the chip carrier 1002. The indentations 1208 are defined by first patterning the top photoresist layer 1102 followed by etching of the chip carrier 1002. A large indentation 1204 provides a template for the protrusion 306 for the die attach pad 110 in FIG. 3, and small indentations 1206 define the shape of the protrusion 304 for the external contact terminals also shown in FIG. 3. Alternate embodiments of the invention may be implemented depending on the patterns defined in the top photoresist layer 1102 in FIG. 11.

Referring now to FIG. 12B, therein is shown the structure of FIG. 11 following the patterning of indentations 1210 corresponding to the embodiment of the leadless package system 600 shown in FIG. 6. The indentations 1210 are defined by first patterning the top photoresist layer 1102 followed by etching of the chip carrier 1002. In this embodiment, only small indentations 1206 are defined and a non-patterned area 1212 for the non-protruding die attach pad 602 is left covered by the top photoresist layer 1102.

Referring now to FIG. 12C, therein is shown the structure of FIG. 11 following the patterning of indentations 1214 corresponding to the embodiment of the leadless package system 700 shown in FIG. 7. In this embodiment only the small indentations 1206 of FIG. 12A are implemented and are spaced for a connection to a flip-chip IC die 718 as shown in FIG. 7.

Referring now to FIG. 13A, therein is shown the structure of FIG. 12A following application of the external coating layer 104 on the indentations 1208 defined in the chip carrier 1002. The external coating layer 104 material is gold, or alternatively, palladium ("Pd"), nickel ("Ni"), silver ("Ag"), tin ("Sn"), their alloys or any combinations of these materials. The external coating layer 104 can be applied using any conventional technique such as plating, sputtering, PVD, CVD, and printing.

Figure 13B:
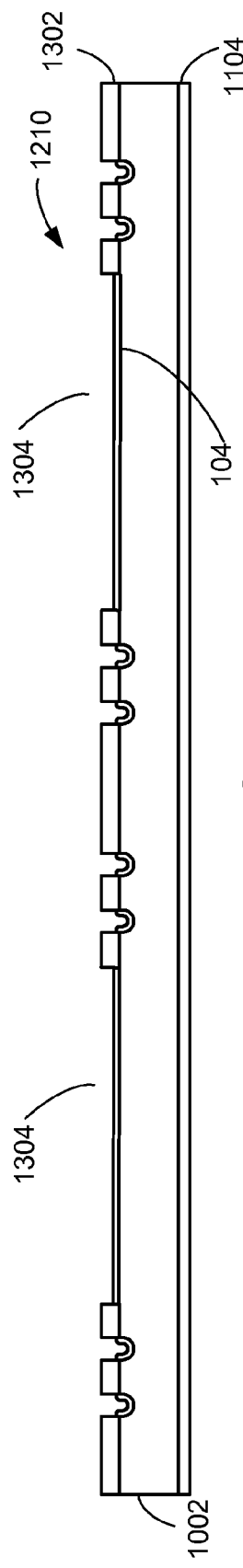
FIG. 13B is the structure of FIG. 12B following removal of the top photoresist layer, application and patterning of a second top photoresist layer, and application of the external coating layer on the indentations and portions of the non-patterned area on the chip carrier.

Referring now to FIG. 13B, therein is shown the structure of FIG. 12B following removal of the top photoresist layer 1102, application and patterning of a second top photoresist layer 1302, and application of the external coating layer 104 on the indentations 1210 and portions of the non-patterned area 1212 on the chip carrier 1002. The new photoresist layer is patterned to define an opening 1304 for the external coating layer 104 underneath the non-protruding die attach pad 602 shown in FIG. 6.

Figure 13C:
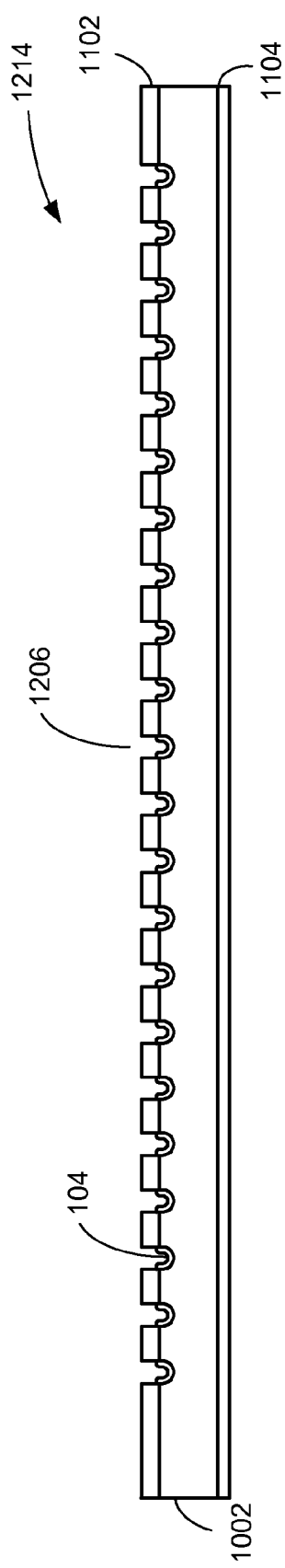
FIG. 13C is the structure of FIG. 12C following application of the external coating layer on the indentations defined in the chip carrier 1002.

Referring now to FIG. 13C, therein is shown the structure of FIG. 12C following application of the external coating layer 104 on the small indentations 1206 defined in the chip carrier 1002. This process step leads to the implementation of the embodiment of the leadless package system 700 shown in FIG. 7.

Figure 13D:
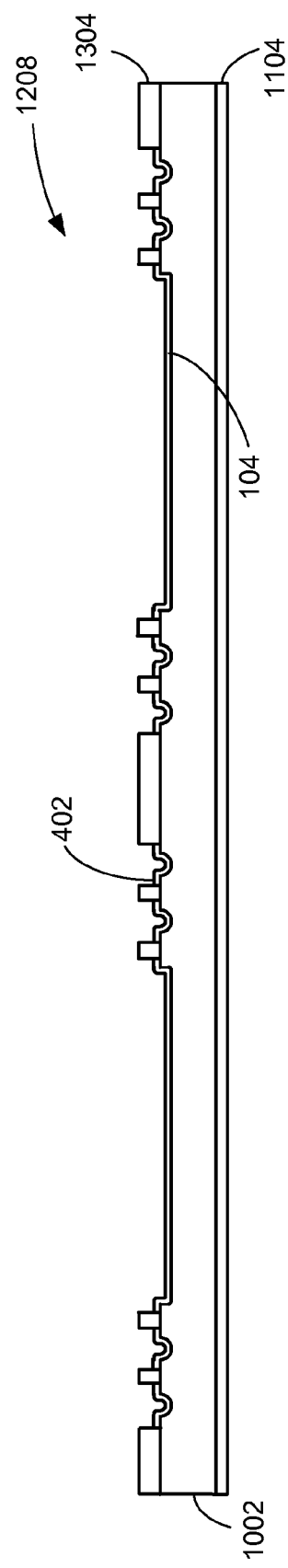
FIG. 13D is the structure of FIG. 12A following removal of the top photoresist layer 1102, application and patterning of a second top photoresist layer 1304, and application of the external coating layer 104 on the chip carrier 1002.

Referring now to FIG. 13D, therein is shown the structure of FIG. 12A following removal of the top photoresist layer 1102, application and patterning of a second top photoresist layer 1304, and application of the external coating layer 104 on the chip carrier 1002. The second photoresist layer 1304 is patterned to widen the indentations 1208 for extensions 402 of the external coating layer employed in the embodiment of the leadless package system 400 shown in FIG. 4.

Figure 14:
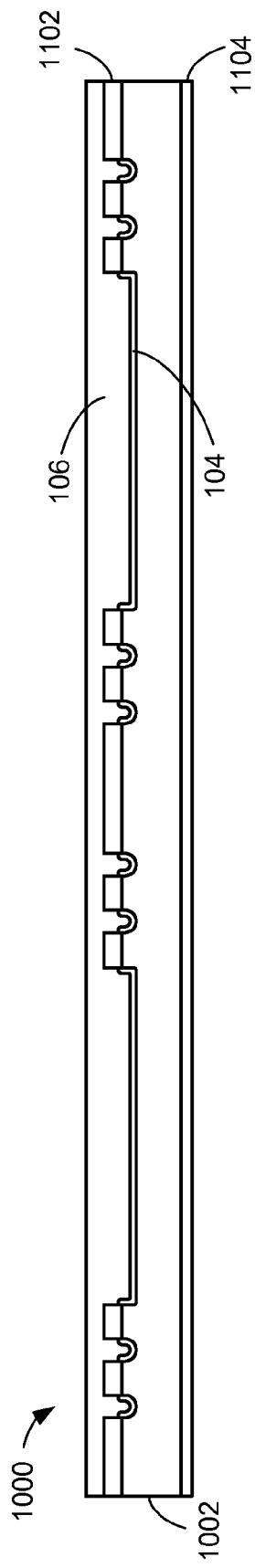
FIG. 14 is the structure of FIG. 13A following application of the conductive layer on top of the external coating layer.

Referring now to FIG. 14, therein is shown the structure of FIG. 13A following application of the conductive layer 106 on top of the external coating layer 104. The conductive layer 106 material is copper ("Cu"), aluminum ("Al"), or their alloys. The conductive layer 106 can be applied using any conventional technique such as plating, sputtering, PVD, CVD, and printing. The structure in FIG. 13A is the typical processing of the embodiment of the invention shown in FIG. 14 through FIG. 22.

Figure 15:
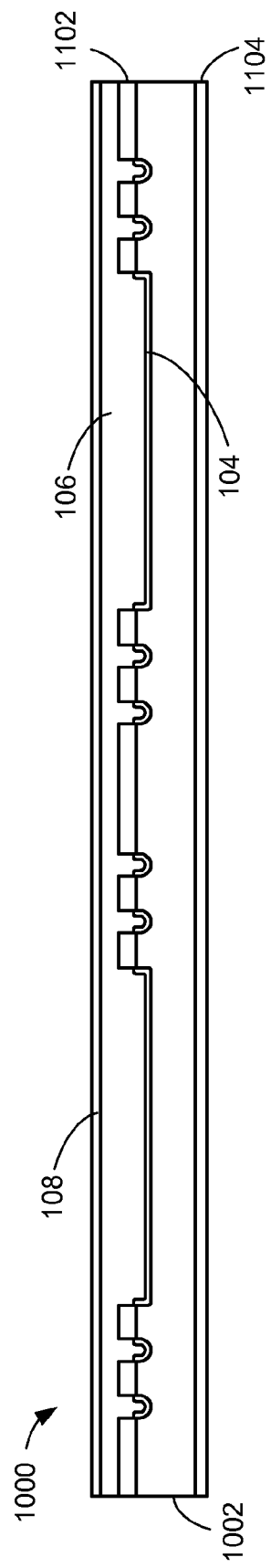
FIG. 15 is the structure of FIG. 14 following application of the internal coating layer on top of the conductive layer.

Referring now to FIG. 15, therein is shown the structure of FIG. 14 following application of the internal coating layer 108 on top of the conductive layer 106. The internal coating layer 108 material is gold, or alternatively, palladium ("Pd"), nickel ("Ni"), silver ("Ag"), tin ("Sn"), their alloys or any combinations of these materials. The internal coating layer 108 can be applied using any conventional technique such as plating, sputtering, PVD, CVD, and printing.

Figure 16:
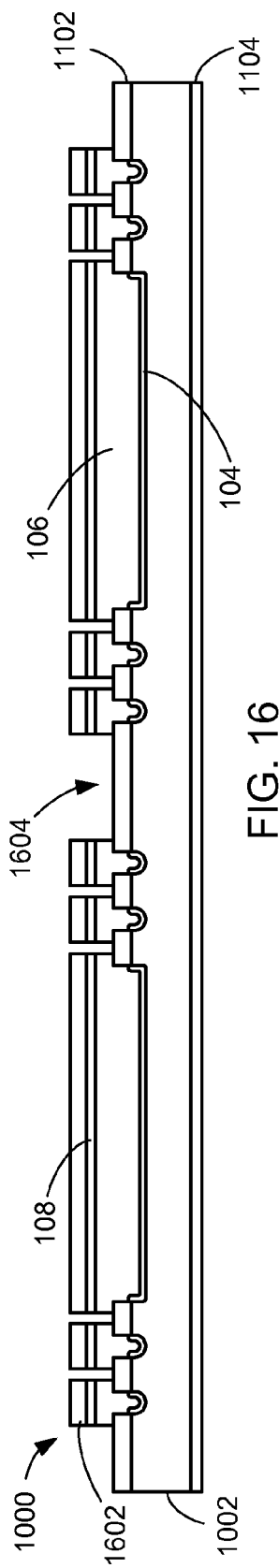
FIG. 16 is the structure of FIG. 15 following deposition and patterning of a second photoresist layer, and patterning of the internal coating layer and a portion of the conductive layer defining isolation trenches.

Referring now to FIG. 16, therein is shown the structure of FIG. 15 following deposition and patterning of a second photoresist layer 1602, and patterning of the internal coating layer 108 and portion of the conductive layer 106, defining isolation trenches 1604. The isolation trenches 1604 define the top shape of the die attach pad 110 and external contact terminals 102 in FIG. 1 and provide space for the encapsulant 120.

Figure 17:
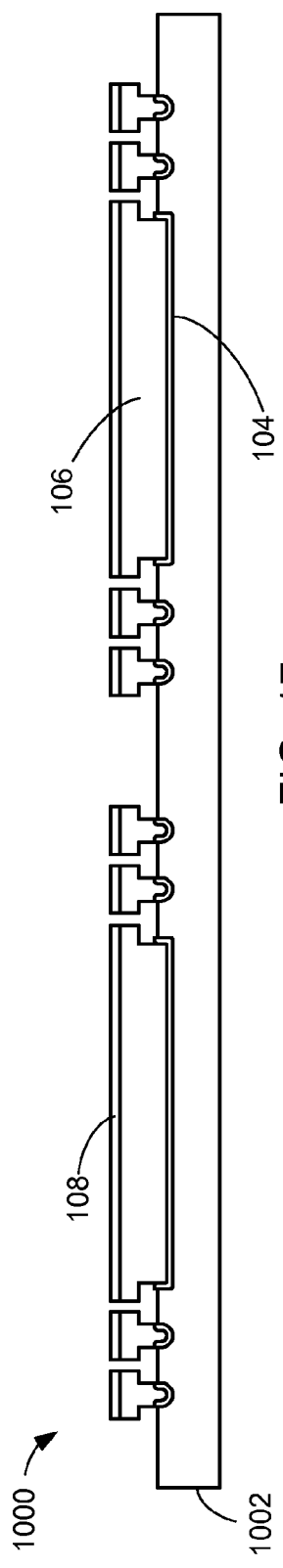
FIG. 17 is the structure of FIG. 16 following stripping or etching of the top photoresist layer, the second photoresist layer, and the bottom photoresist layer.

Referring now to FIG. 17, therein is shown the structure of FIG. 16 following stripping or etching of the top photoresist layer 1102, the second photoresist layer 1602, and the bottom photoresist layer 1104.

Figure 18:
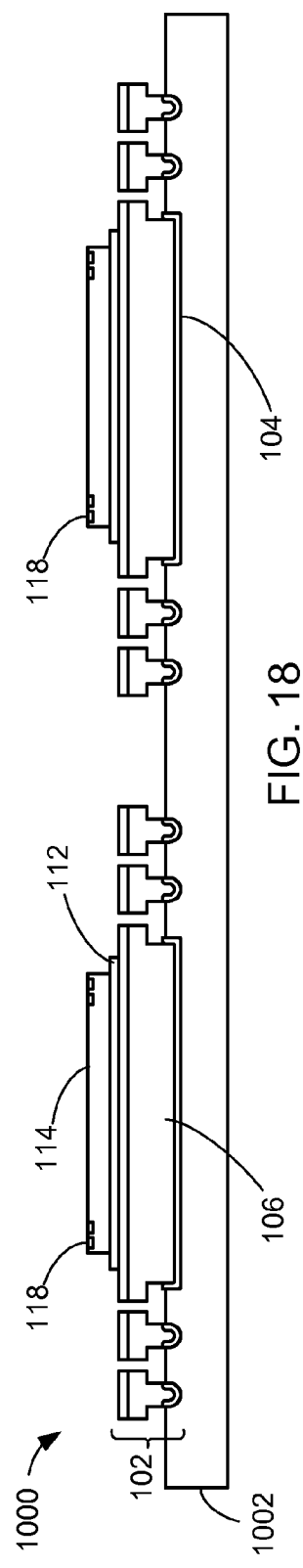
FIG. 18 is the structure of FIG. 17 following attachment of an IC die on a die attach pad using the adhesive.

Referring now to FIG. 18, therein is shown the structure of FIG. 17 following attachment of the IC die 114 on the die attach pad 110 using the adhesive 112. Alternatively, in order to implement the flip-chip embodiment shown in FIG. 7, the flip-chip IC die 702 is attached and connected to the external contact terminals 102 using the solder balls 704.

Referring now to FIG. 19, therein is shown the structure of FIG. 18 following wire bonding of contact pads 118 in the IC die 114 to the internal coating layer 108 on the external contact terminals 102. The bond wires 116 provide electrical connections between the contact pads 118 in the IC die 114 and the external contact terminals 102. Bond wires 116 are not needed for the flip-chip embodiment shown in FIG. 7, but are used for the stacked-chip configuration shown in FIG. 9.

Referring now to FIG. 20, therein is shown the structure of FIG. 19 after encapsulation of the portions thereof above the chip carrier 1002 using the encapsulant 120.

Referring now to FIG. 21, therein is shown the structure of FIG. 20 following dissolving the chip carrier 1002 shown in FIG. 20. The protrusion 304 of the external contact terminals 102 and the die attach pad 110 are exposed following dissolution of the chip carrier 1002.

Figure 22:
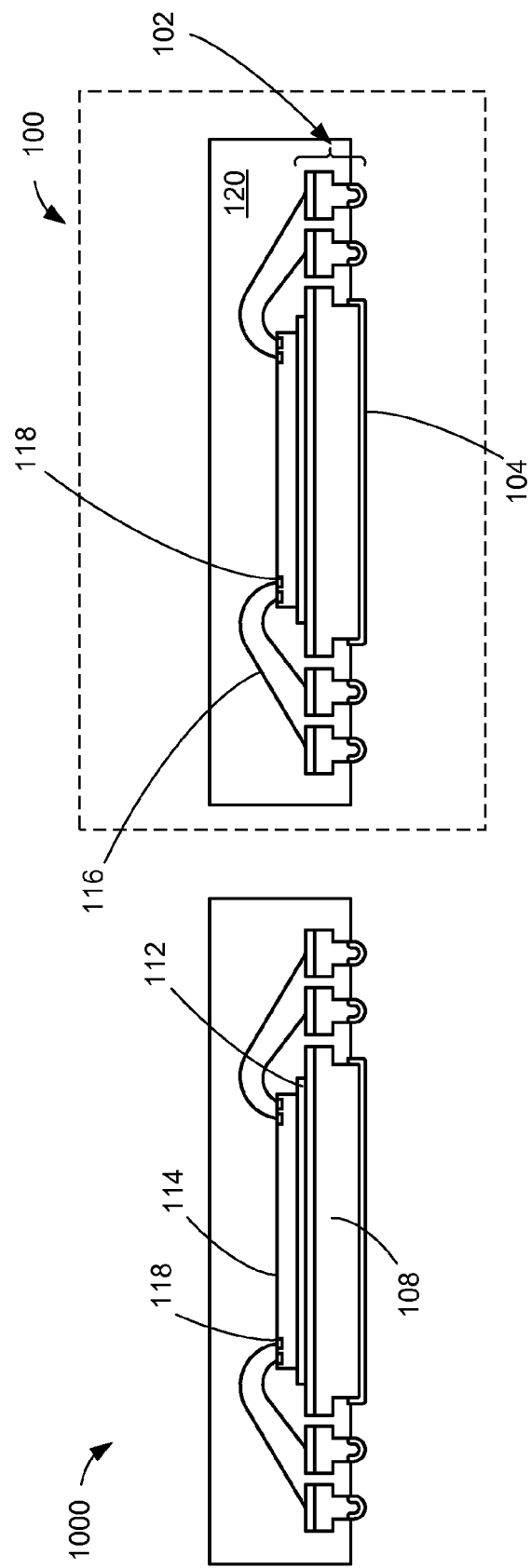
FIG. 22 is the structure of FIG. 21 following cutting of the encapsulant.

Referring now to FIG. 22, therein is shown the structure of FIG. 21 following cutting of the encapsulant 120. This separation process ("singulation") defines the IC package system 100.

Figure 23:
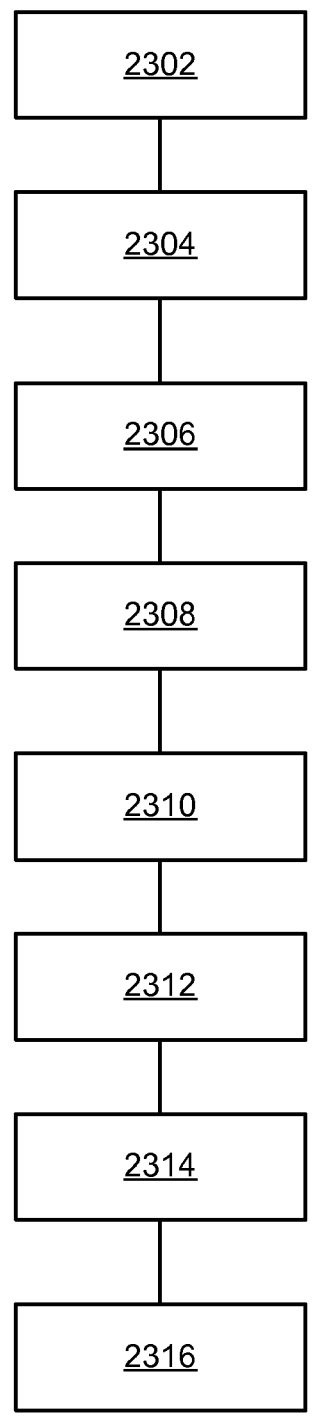
FIG. 23 is a flow chart of a system for fabricating a leadless package system in accordance with an embodiment of the present invention.

Referring now to FIG. 23, therein is shown a flow chart of a method 2300 for manufacturing a leadless package system 100 in an embodiment of the present invention. The method 2300 includes providing a chip carrier having indentations patterned therein in a block 2302; placing an external coating layer in the indentations in the chip carrier in a block 2304; layering a conductive layer on top of the external coating layer in a block 2306; depositing an internal coating layer on the conductive layer in a block 2308; patterning the internal coating layer and the conductive layer to define external contact terminals in a block 2310; connecting an integrated circuit die to the external contact terminals in a block 2312; encapsulating the integrated circuit die and external contact terminals in a block 2314; and separating the chip carrier from the external coating layer in a block 2316.

It has been discovered that the present invention thus has numerous aspects. A principal aspect that has been unexpectedly discovered is that the present invention provides an effective and reliable leadless packaging system for integrated circuits.

Another aspect is the present invention is that the protrusion in the external contact terminals and the die attach pad increase the contact area for solder joints to printed circuit boards. The resulting solder joint fillet thus provides added mechanical strength.

Another aspect of the present invention is that the T-profile of the external contact terminals and die attach pads locks these elements to the encapsulant. The locking effect increases their adhesion strength to the encapsulant, significantly reducing external contact pad and die attach pad delamination failures.

Yet another aspect of the present invention is that the external contact layer may be extended over planar portions of the conductive layer, further improving the mechanical strength of the solder joints to printed circuit boards.

Still another aspect of the present invention is that the leadless packaging system for integrated circuits provides a versatile platform for packaging standard IC dies, flip-chip IC dies, or a combination thereof. The system supports both wire bond and solder ball connections between the IC chip contact pads and the external contact terminals.

Yet another aspect of the present invention is that it valuably supports and services the historical trend of reducing costs, simplifying systems, and increasing performance.

These and other valuable aspects of the present invention consequently further the state of the technology to at least the next level.

Thus, it has been discovered that the leadless package system for integrated circuits of the present invention furnishes important and heretofore unknown and unavailable solutions, capabilities, and functional aspects for packaging of integrated circuits. The resulting processes and configurations are straightforward, cost-effective, uncomplicated, highly versatile and effective, can be surprisingly and unobviously implemented by adapting known technologies, and are thus readily suited for efficiently and economically manufacturing leadless packaging systems for integrated circuits fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing a leadless package system, comprising:
   providing a chip carrier having indentations defining a pattern for a protrusion for external contact terminals;
   placing an external coating layer in the indentations in the chip carrier;
   layering a conductive layer on top of the external coating layer;
   depositing an internal coating layer on the conductive layer;
   patterning the internal coating layer and the conductive layer to define external contact terminals with a T-shape profile;
   connecting an integrated circuit die to the external contact terminals;
   encapsulating the integrated circuit die and the external contact terminals; and
   separating the chip carrier from the external coating layer.

2. The method as claimed in claim 1 further comprising patterning the internal coating layer and the conductive layer to define a die attach pad with a T-shape profile.

3. The method of claim 1 further comprising:
   patterning the internal coating layer and the conductive layer to define a die attach pad with a T-shape profile; and
   providing the chip carrier having an additional indentation defining a pattern for a protrusion for the die attach pad.

4. The method of claim 1 wherein the patterning the internal coating layer and the conductive layer define the external contact terminals with the external coating layer with extensions surrounding the protrusion.

5. The method of claim 1 further comprising:
   providing the chip carrier having an additional indentation defining a pattern for a die attach protrusion for a die attach pad; and
   patterning the internal coating layer and the conductive layer to define the die attach pad with a T-shape profile and the external coating layer with extensions surrounding the die attach protrusion.

6. A method for manufacturing a leadless package system, comprising:
   providing a chip carrier having indentations defining a pattern for a protrusion for external contact terminals;
   depositing an external coating layer covering the indentations in the chip carrier;
   depositing a conductive layer on the external coating layer;
   depositing an internal coating layer on the conductive layer;
   patterning the internal coating layer and the conductive layer to define external contact terminals with a T-shape profile;
   connecting an integrated circuit die to one or more of the external contact terminals;
   encapsulating the integrated circuit die and the external contact terminals with an encapsulant; and
   dissolving the chip carrier.

7. The method as claimed in claim 6 further comprising patterning the internal coating layer and the conductive layer to define a die attach pad with a T-shape profile.

8. The method of claim 6 further comprising:
   patterning the internal coating layer and the conductive layer to define a die attach pad with a T-shape profile; and
   providing the chip carrier having an additional indentation defining a pattern for a protrusion for the die attach pad.

9. The method of claim 6 wherein the patterning the internal coating layer and the conductive layer define the external contact terminals with the external coating layer with extensions surrounding the protrusion.

10. The method of claim 6 further comprising:
    providing the chip carrier having an additional indentation defining a pattern for a die attach protrusion for a die attach pad; and
    patterning the internal coating layer and the conductive layer to define the die attach pad with a T-shape profile and the external coating layer with extensions surrounding the die attach protrusion.

* * * * *

UNITED STATES PATENT AND TRADEMARK OFFICE
CERTIFICATE OF CORRECTION

| | | |
|---|---|---|
| PATENT NO. | : 7,993,979 B2 | Page 1 of 1 |
| APPLICATION NO. | : 11/964567 | |
| DATED | : August 9, 2011 | |
| INVENTOR(S) | : Do et al. | |

It is certified that error appears in the above-identified patent and that said Letters Patent is hereby corrected as shown below:

Column 6:

line 19, delete "Referring now to FIG. 1, therein" and insert therefor --Referring now to FIG. 11, therein--

Signed and Sealed this
Twenty-fifth Day of September, 2012

David J. Kappos
*Director of the United States Patent and Trademark Office*